US010683585B2

(12) United States Patent
Sahlholm et al.

(10) Patent No.: US 10,683,585 B2
(45) Date of Patent: Jun. 16, 2020

(54) METHOD FOR MELTING AND SOLIDIFICATION OF SCINTILLATING MATERIAL IN MICROMECHANICAL STRUCTURES

(71) Applicant: SCINT-X AB, Kista (SE)

(72) Inventors: Anna Sahlholm, Huddinge (SE); Olof Svenonius, Stockholm (SE)

(73) Assignee: VIVAMOS LIMITED, Southampton (GB)

(*) Notice: Subject to any disclaimer, the term of this patent is extended or adjusted under 35 U.S.C. 154(b) by 168 days.

(21) Appl. No.: 15/777,224

(22) PCT Filed: Nov. 16, 2016

(86) PCT No.: PCT/SE2016/051130
§ 371 (c)(1),
(2) Date: May 18, 2018

(87) PCT Pub. No.: WO2017/086866
PCT Pub. Date: May 26, 2017

(65) Prior Publication Data
US 2018/0347070 A1 Dec. 6, 2018

Related U.S. Application Data

(60) Provisional application No. 62/256,798, filed on Nov. 18, 2015.

(51) Int. Cl.
*C30B 11/00* (2006.01)
*G21K 4/00* (2006.01)
*C30B 29/12* (2006.01)

(52) U.S. Cl.
CPC .......... *C30B 11/003* (2013.01); *C30B 11/002* (2013.01); *C30B 11/006* (2013.01); *C30B 29/12* (2013.01); *G21K 4/00* (2013.01)

(58) Field of Classification Search
CPC ..... C30B 11/00; C30B 11/002; C30B 11/003; C30B 11/006; C30B 9/00; C30B 9/04;
(Continued)

(56) References Cited

U.S. PATENT DOCUMENTS 6,744,052 B1* 6/2004 Petersson ............. G01T 1/2018
250/361 R
8,652,253 B2 2/2014 Eichler et al.
(Continued)

FOREIGN PATENT DOCUMENTS

DE 102007026298 A1 12/2008
WO 2014/109691 A1 7/2014
WO 2014/200077 A1 12/2014

OTHER PUBLICATIONS

X.Badel et al.; Improvement of an X-ray imaging detector based on a scintillating guides screen;Nuclear Instruments and Methods in Physics Research Section A: Accelerators, Spectrometers, Detectors and Associated Equipment; Jul. 11, 2002; pp. 129-135; vol. 487, Issues 1-2.
(Continued)

*Primary Examiner* — Kenneth A Bratland, Jr.
(74) *Attorney, Agent, or Firm* — Young & Thompson (57) ABSTRACT

Disclosed is a method for melting and solidification of a scintillating material in micromechanical structures, including controlling the melting and solidification of the scintillating material by individually controlled heat sources, a top heater and a bottom heater, placed above and below a process chamber, housing a sample with the micromechanical structures and the scintillating material. The heaters are controlled to set a vertical temperature gradient over the sample to control the melting and solidification of the scintillating material. During melting, the top heater is ramped up and stabilized at a temperature where no melting occurs and the bottom heater is ramped up and stabilized at
(Continued)

a temperature where melting occurs during a period of time while the scintillating material melts and flows into the micromechanical structures. During solidification, the temperature of the bottom heater decreases to enable solidification to take place starting from the bottom of the micromechanical structures.

14 Claims, 4 Drawing Sheets (58) Field of Classification Search
CPC ....... C30B 29/10; C30B 29/12; Y10T 117/00; Y10T 117/10; Y10T 117/1004; Y10T 117/1008; Y10T 117/1016; G21K 4/00
USPC ... 117/11, 53, 73–74, 81, 83, 200–202, 204, 117/206, 937
See application file for complete search history.

(56) References Cited

U.S. PATENT DOCUMENTS 9,368,585 B2    6/2016   Eichler et al.
2003/0131789 A1*   7/2003   Amemiya ............... C30B 11/00
                                              117/200
2008/0311417 A1*  12/2008   Eichler ................. C30B 11/002
                                              428/544
2014/0103493 A1    4/2014   Eichler et al.

OTHER PUBLICATIONS

Extended European search report, dated Jun. 12, 2019, from corresponding European Patent Application No. 16866752.5-1103.
Badel X. et al.: "Improvement of an X-ray imaging detector based on a scintillating guides screen.", Nuclear Instruments & Methods in Physics Research, Section A., vol. 487, Jul. 11, 2002 (Jul. 11, 2002), pp. 129-132, XP004369013.
Hormozan Y. et al: "Towards High-Resolution X-Ray Imaging Using a Structured Scintillator"., IEEE Transactions on Nuclear Science, vol. 59, No. 1, Feb. 1, 2012 (Feb. 1, 2012), pp. 19-23, XP011408679.
International Search Report, dated Mar. 16, 2017, from corresponding PCT/SE2016/051130 application.

* cited by examiner

METHOD FOR MELTING AND SOLIDIFICATION OF SCINTILLATING MATERIAL IN MICROMECHANICAL STRUCTURES

TECHNICAL FIELD

The invention generally relates to situations where a scintillating material is melted into micromechanical structures to be used as a structured scintillator, and an apparatus or system and method for melting and solidification of such scintillating material in micromechanical and possibly porous structures.

BACKGROUND

It is common practice to use a scintillator in combination with an image sensor to capture x-ray images. In such a setup, the scintillator absorbs x-ray photons and emits secondary photons, which are typically in the visible part of the electromagnetic spectrum and can be detected by an image sensor placed behind the scintillator. In an unstructured or semi-structured scintillator, the secondary photons spread laterally while traveling through the scintillator towards the image sensor. This results in blurring of the image because the image sensor registers signal not only in the pixel right below where the x-ray photon was absorbed, but also in other pixels in its vicinity. This mechanism deteriorates the image resolution of the x-ray detecting system and in many cases limits the achievable image resolution of the system. To overcome this problem, a structured scintillator comprising a micromechanical structure such as a pore matrix filled with scintillating material can be used. The structured scintillator eliminates, or at least significantly reduces, the lateral spread of secondary photons in the scintillator, thus avoiding deterioration of the image resolution.

In some applications, the use of micromechanical trenches, functioning as elongated scintillation strips is of particular interest, for example as scintillating gratings in x-ray phase contrast imaging.

When melting and solidifying scintillator material in micromechanical structures, there are many factors that determine the quality of the final crystal. In a conventional furnace, there is often problem with formation of bubbles during the melting, leading to undesired voids in the solidified scintillating material. Another problem with a conventional furnace is that heating is typically more or less isotropic, which means that there is little or no control of the nucleation process, i.e. of where nucleation starts during the solidification process. In addition to the undesired formation of voids mentioned above, this uncontrolled nucleation also typically results in an undesired poly-crystalline structure with small crystal grains, rather than the desired large crystal grains or ultimately single-crystalline structure. Due to these effects, there will typically be non-uniform characteristics when measured over the area of the scintillator, in terms of (i) x-ray absorption, (ii) efficiency of secondary photon generation, and/or (iii) optical guiding of the secondary photons towards the exit surface of the scintillator.

SUMMARY

The present invention overcomes these and other drawbacks of the prior art.

It is a general object to provide an improved scintillator with respect to uniformity, x-ray absorption, and light output.

It is also an object to provide a fast melting/solidification process, which enables a short cycle time in production.

It is a specific object to provide a method for melting and solidification of scintillating material in micromechanical and possibly porous structures.

It is another specific object to provide a system for melting and solidification of scintillating material in micromechanical and possibly porous structures.

In particular it is desirable to achieve a highly crystalline filling in each structure, without voids, impurities or variations in the chemical composition.

The micromechanical structures may include any deep, narrow structures such as pores, trenches and any geometry which combines pores and trenches.

A basic idea is to control the melting and solidification of the scintillating material by individually controlled heat sources above and below a process chamber, which contains the sample with micromechanical structures and the scintillating material. During the melting process, the scintillating material flows into the micromechanical structures. During the solidification phase, the scintillating material crystallizes inside this micromechanical structure.

According to a first aspect, there is provided a method for melting and solidification of a scintillating material in micromechanical structures. The method includes controlling the melting and solidification of the scintillating material by individually controlled heat sources, a top heater and a bottom heater, placed above and below a process chamber which includes a sample with the micromechanical structures and the scintillating material, wherein the heaters are controlled to set a vertical temperature gradient over the sample to control the melting and solidification of the scintillating material. During the melting process, the top heater is ramped up and stabilized at a temperature where no melting occurs and the bottom heater is ramped up and stabilized at a temperature where melting occurs during a period of time while the scintillating material melts and flows into the micromechanical structures. During the solidification phase, the temperature of the bottom heater is ramped down to enable solidification to take place starting from the bottom of the micromechanical structures.

According to a second aspect, there is provided a system for melting and solidification of a scintillating material in micromechanical structures. The system comprises a process chamber in which a sample can be placed, the sample comprising the scintillating material and the micromechanical structures, a top heater placed above the process chamber, a bottom heater placed below the process chamber, and at least one temperature controller for controlling the temperature of the top heater and the bottom heater. The at least one temperature controller is configured to control the temperature of the top heater and bottom heater individually to thereby control the melting and solidification of the scintillating material. During the melting process, the top heater is controlled to be ramped up and stabilized at a temperature where no melting occurs and the bottom heater is controlled to be ramped up and stabilized at a temperature where melting occurs during a period of time to enable the scintillating material to melt and flow into the micromechanical structures. During the solidification phase, the temperature of the bottom heater is controlled to be ramped down to enable solidification to take place starting from the bottom of the micromechanical structures.

According to a third aspect, there is provided a scintillator manufactured using the method according to the first aspect.

Adding to the basic idea, additional heat sources may optionally be added around the periphery of the process chamber to further improve the temperature control and uniformity.

Basically, the invention offers the following advantages: Higher uniformity by the possibility to set a vertical temperature gradient over the sample, making it possible to accurately control the melting and solidification of the scintillating material in the micromechanical structure.

Another advantage is shorter process time because such a system can be designed so that the thermal mass is small compared with a conventional furnace. This is advantageous both to reduce the effect of unwanted chemical and physical processes that occur at high temperatures, and also to reduce the cycle time in production.

Other advantages of the invention will be appreciated when reading the below detailed description.

BRIEF DESCRIPTION OF THE DRAWINGS

The invention, together with further objects and advantages thereof, may best be understood by making reference to the following description taken together with the accompanying drawings, in which.

DETAILED DESCRIPTION

Throughout the drawings, the same reference numbers are used for similar or corresponding elements.

A basic idea is to control the melting and solidification of the scintillating material by individually controlled heat sources above and below a process chamber, which contains the sample with micromechanical structures and the scintillating material. During the melting process, the scintillating material flows into the micromechanical structures. During the solidification phase, the scintillating material crystallizes inside this micromechanical structure.

Therefore, there is provided a method for melting and solidification of a scintillating material in micromechanical structures, where the method includes controlling the melting and solidification of the scintillating material by individually controlled heat sources, a top heater and a bottom heater, placed above and below a process chamber which includes a sample with the micromechanical structures and the scintillating material, wherein the heaters are controlled to set a vertical temperature gradient over the sample to control the melting and solidification of the scintillating material. During the melting process, the top heater is ramped up and stabilized at a temperature where no melting occurs and the bottom heater is ramped up and stabilized at a temperature where melting occurs during a period of time while the scintillating material melts and flows into the micromechanical structures. During the solidification phase, the bottom heater is ramped down to enable solidification to take place starting from the bottom of the micromechanical structures.

In an embodiment at least the bottom heater is operated at a temperature above the melting temperature of the scintillating material during the melting process.

In another embodiment, during the solidification phase the top heater is at least temporarily elevated to a temperature above the melting temperature to create a vertical temperature gradient.

Figure 3:
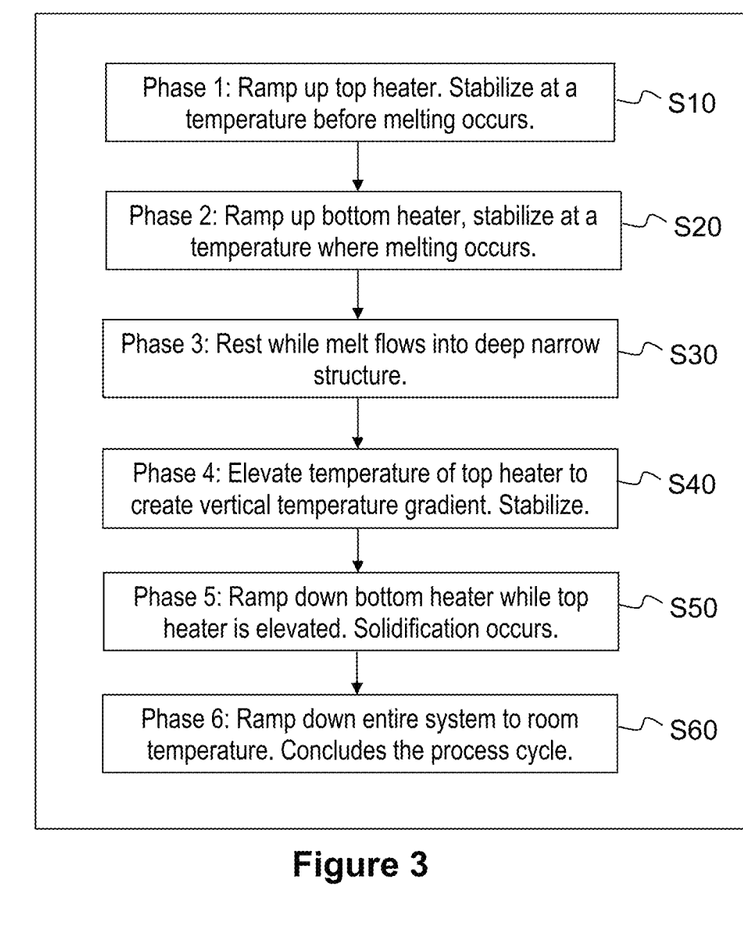
FIG. 3 is an exemplary flow diagram illustrating a particular example of a melting/solidification process comprising a number of phases.

In a particular embodiment, and as schematically illustrated in the flow diagram in FIG. 3, the melting and solidification of the scintillating material is controlled according to a procedure comprising the following steps:

a step S10 of ramping up the top heater and stabilizing at a temperature before melting of the scintillating material occurs, the top heater being placed above the process chamber, the sample comprising the scintillating material placed above the micromechanical structures;

a step S20 of ramping up the bottom heater and stabilizing at a temperature where melting of the scintillating material occurs, the bottom heater being placed below the process chamber, to create a first vertical temperature gradient over the sample in the process chamber and allow melting of the scintillating material;

a step S30 of waiting, while maintaining the temperatures of the top heater and bottom heater, until the scintillating material has melted and flowed into the micromechanical structures;

a step S40 of elevating the temperature of the top heater and stabilizing the temperature to create a second vertical temperature gradient over the sample in the process chamber in an opposite direction than the first vertical temperature gradient;

a step S50 of ramping down the temperature of the bottom heater to allow solidification of the scintillating material to take place starting from the bottom of the sample; and a step S60 of ramping down both the top heater and the bottom heater to room temperature.

In an embodiment the micromechanical structures includes deep, narrow structures such as pores, trenches and/or any geometry which combines pores and trenches. In a particular embodiment the micromechanical structures are part of a structured scintillator.

Figure 1A:
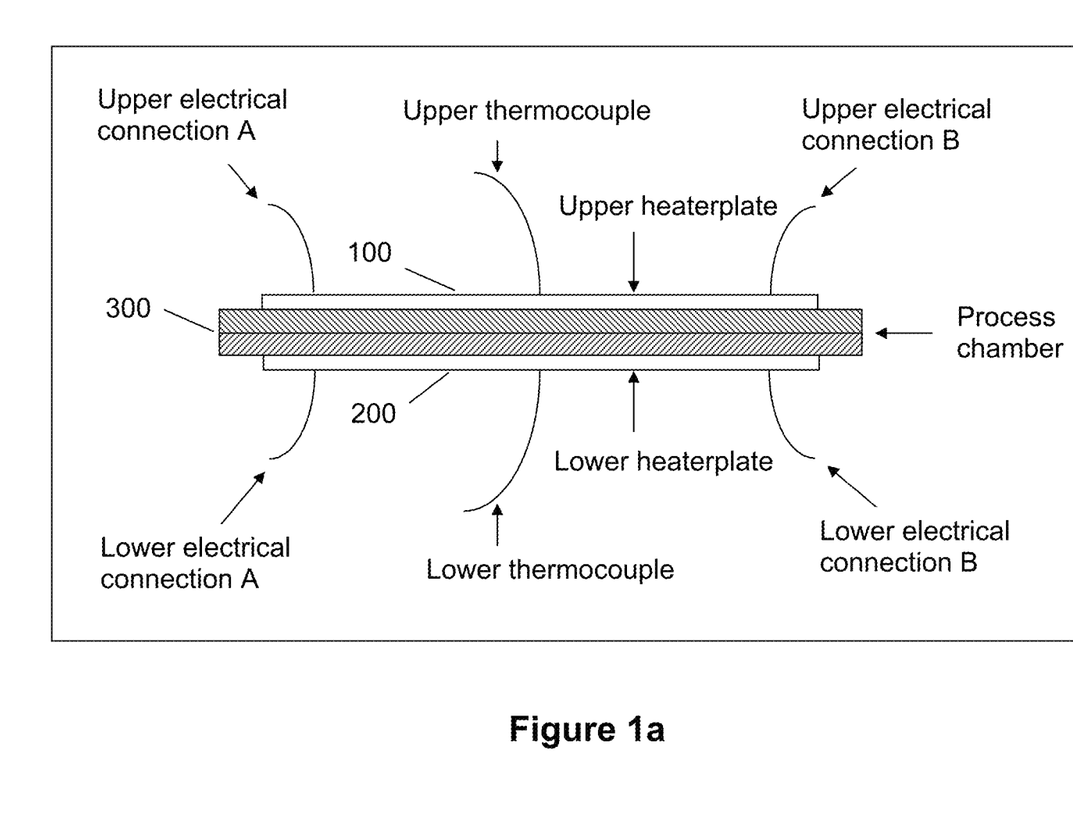
FIG. 1a is a schematic diagram illustrating an example of a melting/solidification system seen from the side.
Figure 1B:
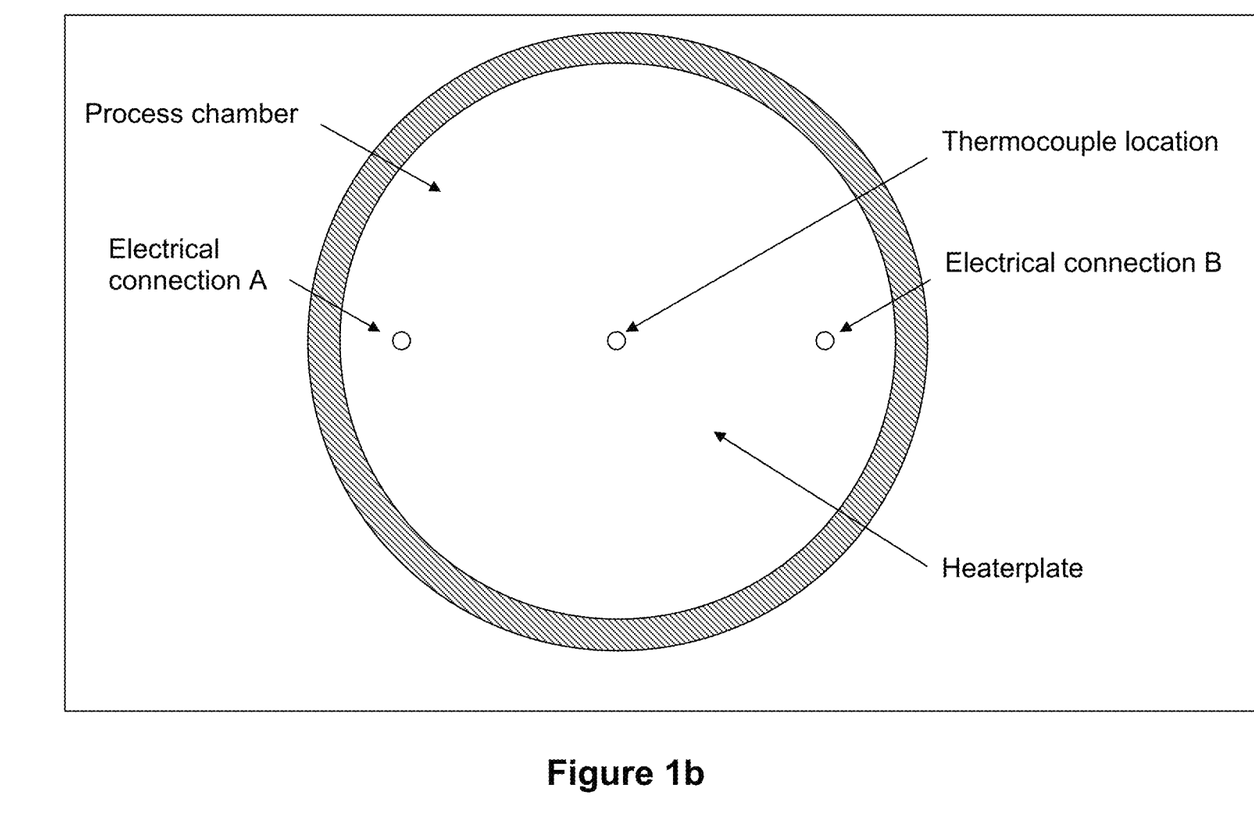
FIG. 1b is a schematic diagram illustrating an example of a melting/solidification system seen from above.

According to a second aspect, there is provided a system for melting and solidification of a scintillating material in micromechanical structures, as schematically illustrated in FIGS. 1a, 1b and 1c. The system comprises a process chamber 300 in which a sample can be placed, the sample comprising the scintillating material and the micromechanical structures, a top heater 100 placed above the process chamber 300, a bottom heater 200 placed below the process chamber 300, and at least one temperature controller 400 for controlling the temperature of the top heater 100 and the bottom heater 200. The at least one temperature controller 400 is configured to control the temperature of the top heater 100 and bottom heater 200 individually to thereby control the melting and solidification of the scintillating material. During the melting process, the top heater 100 is controlled to be ramped up and stabilized at a temperature where no melting occurs and the bottom heater 200 is controlled to be ramped up and stabilized at a temperature where melting occurs during a period of time to enable the scintillating material to melt and flow into the micromechanical structures. During the solidification phase, the temperature of the bottom heater 200 is controlled to be ramped down to enable solidification to take place starting from the bottom of the micromechanical structures.

In an embodiment, the at least one temperature controller is configured to control, during the melting process, at least the bottom heater to be operated at a temperature above the melting temperature of the scintillating material.

In another embodiment the at least one temperature controller is configured to control, during the solidification phase, the top heater to be at least temporarily elevated to a temperature above the melting temperature to create a vertical temperature gradient.

In a particular embodiment, and as illustrated in FIG. 1c, the system comprises separate temperature controllers 400 for the top heater 100 and bottom heater 200. In another particular embodiment the system may comprise one or more additional heaters placed along the periphery of the process chamber 300. In yet another particular embodiment one or more of the heaters may comprise several zones, where the temperature of each zone may be individually controlled.

The invention will now be described with reference to some exemplary and non-limiting embodiments.

FIG. 1a is a schematic diagram illustrating an example of a melting/solidification system seen from the side. Basically, the system comprises a process chamber placed between two individually regulated heaters. The heaters are regulated by temperature controllers, receiving input from thermocouples placed in physical contact with the heaters.

More specifically, the system comprises a process chamber, where the sample with micromechanical structures and the scintillating material rests and in which the melting/solidification process takes place, and two heater plates, on opposite sides of the process chamber. Furthermore the system comprises electrical connections to the heater plates and thermocouples attached to each heater plate, used for temperature regulation.

FIG. 1b is a schematic diagram illustrating an example of a melting/solidification system seen from above. The system comprises the same parts as described in FIG. 1a above.

Figure 2:
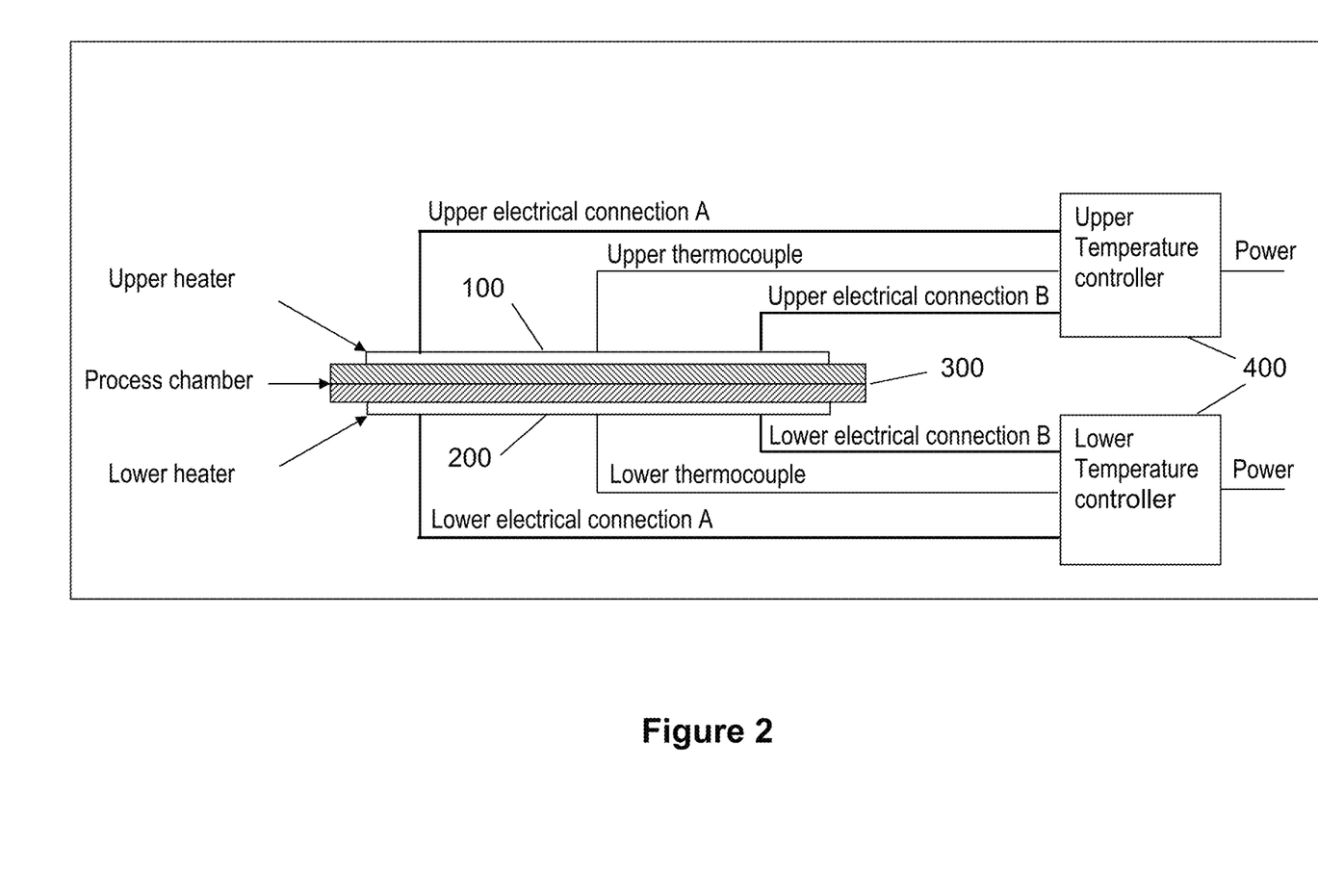
FIG. 2 is a schematic exemplary block diagram for a melting/solidification system according to another example.

FIG. 2 is a schematic exemplary block diagram for a melting/solidification system according to another example. In this particular example, the system comprises the parts described in FIGS. 1a and 1b above, plus separate temperature controllers for the upper and lower heater respectively. As an alternative, both heaters can be regulated using one and the same temperature controller.

The method described herein is applicable to any micromechanical structures such as pores, trenches and any geometry which combines pores and trenches.

FIG. 3 is an exemplary flow diagram illustrating an example of a typical melting/solidification process comprising a number of phases. An exemplary scintillating material is caesium iodide (CsI), which has a melting temperature of approximately 620° C. Other scintillating materials with melting points below the melting temperature of the micromechanical structure may also be used. In a particular example, a micromechanical structure of silicon can be used, which has a melting temperature of about 1410° C.

In this example there are six phases:

Phase 1: Ramp up the top heater to a stable temperature; stabilize before any melting occurs.

Phase 2: Ramp up the bottom heater to a temperature where melting does occur. Stabilize the temperature. It can be noted that phase 2 can start before the stable temperature in phase 1 has been reached. Also, both heaters do not necessarily have to be operated at a temperature above the melting temperature of the scintillating material. It may be sufficient for one of the heaters such as the bottom heater to be operated at a temperature above the melting temperature.

Phase 3: Wait (i.e. maintain the set temperatures) while the melt flows into the micromechanical structures.

Phase 4: Elevate the temperature of the top heater above the scintillating material's melting point and stabilize the temperature to create a vertical gradient in temperature. After elevation, the temperature is thus stabilized in an elevated state.

Phase 5: Ramp down the temperature of the bottom heater while the top heater is in the elevated state. Solidification takes place (below the melting temperature), starting from the bottom of the micromechanical structure, resulting in high quality crystal formation.

Phase 6: Ramp down entire system to room temperature. This concludes the process cycle.

The time duration of each phase is typically determined by programmed parameters in the temperature controllers, such as temperature ramp speeds in ° C. per minute and hold times in minutes. The thermal time constant of the system and available power available to the heaters may limit the speed with which temperature can be raised or lowered. In this exemplary melting/solidification system, the time duration for phases 1-4 combined is typically less than one hour; the time duration for phases 5-6 combined is typically less than 2 hours.

The system, and the temperature controllers in particular, is/are thus configured to implement the above melting/solidification process In this example, it is important to heat the sample with micromechanical structures from underneath to achieve a good flow of the liquid scintillating material liquid into the micromechanical structure, thus avoiding the formation of bubbles and voids. Phases 1 to 3 of the exemplary process described here ensure that the sample is heated this way.

It is also important that a vertical temperature gradient is present during cooling of the sample, i.e. during the solidification phase. The gradient ensures that crystallization in the micromechanical structures starts from the bottom of each structure, forming a high-quality crystal. Phases 4 to 5 of the exemplary process described here ensure that the cooling takes place this way.

As another example, the top and bottom heaters may comprise several zones, each controlled by individual thermocouples and temperature controllers, to improve temperature uniformity over the process chamber's area.

In addition, another exemplary configuration may comprise one or several heaters, each controlled by individual thermocouples and temperature controllers, placed along the periphery of the process chamber in order to further improve temperature uniformity over the process chamber's area.

For more information on micromechanical structures, scintillators and scintillating materials and an example of a basic melting procedure, reference can be made to our U.S. Pat. No. 6,744,052. The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible.

The invention claimed is:

1. A method for melting and solidification of a scintillating material in micromechanical structures, wherein the method includes controlling the melting and solidification of the scintillating material by individually controlled heat sources, a top heater (100) and a bottom heater (200), placed above and below a process chamber (300), which includes a sample with the micromechanical structures and the scintillating material, wherein the heaters (100, 200) are controlled to set a vertical temperature gradient over the sample to control the melting and solidification of the scintillating material:

wherein, during the melting process, the top heater is ramped up and stabilized at a temperature where no melting occurs and the bottom heater is ramped up and stabilized at a temperature where melting occurs during a period of time while the scintillating material melts and flows into the micromechanical structures, and wherein, during the solidification phase, the temperature of the bottom heater (200) is ramped down to enable solidification to take place starting from the bottom of the micromechanical structures.

2. The method of claim 1, wherein, during the melting process, at least the bottom heater is operated at a temperature above the melting temperature of the scintillating material.

3. The method of claim 1, wherein, during the solidification phase, the top heater is at least temporarily elevated to a temperature above the melting temperature to create a vertical temperature gradient.

4. The method of claim 1, wherein the melting and solidification of the scintillating material is controlled according to the following procedure:

ramping up (S10) the top heater (100) and stabilizing at a temperature before melting of the scintillating material occurs, the top heater (100) being placed above the process chamber (300), the sample comprising the scintillating material placed above the micromechanical structures;

ramping up (S20) the bottom heater (200) and stabilizing at a temperature where melting of the scintillating material occurs, the bottom heater (200) being placed below the process chamber (300), to create a first vertical temperature gradient over the sample in the process chamber (300) and allow melting of the scintillating material;

waiting (S30), while maintaining the temperatures of the top heater (100) and bottom heater (200), until the scintillating material has melted and flowed into the micromechanical structures;

elevating (S40) the temperature of the top heater (100) and stabilizing the temperature to create a second vertical temperature gradient over the sample in the process chamber (300) in an opposite direction than the first vertical temperature gradient;

ramping down (S50) the temperature of the bottom heater (200) to allow solidification of the scintillating material to take place starting from the bottom of the sample; and ramping down (S60) both the top heater (100) and the bottom heater (200) to room temperature.

5. The method of claim 4, wherein a time duration of steps S10-S40 combined is less than one hour and a time duration of steps S50-S60 combined is less than two hours.

6. The method of claim 1, wherein the micromechanical structures includes pores, trenches and/or any geometry which combines pores and trenches.

7. The method of claim 1, wherein the micromechanical structures are part of a structured scintillator.

8. The method of claim 2, wherein, during the solidification phase, the top heater is at least temporarily elevated to a temperature above the melting temperature to create a vertical temperature gradient.

9. The method of claim 2, wherein the melting and solidification of the scintillating material is controlled according to the following procedure:

ramping up (S10) the top heater (100) and stabilizing at a temperature before melting of the scintillating material occurs, the top heater (100) being placed above the process chamber (300), the sample comprising the scintillating material placed above the micromechanical structures;

ramping up (S20) the bottom heater (200) and stabilizing at a temperature where melting of the scintillating material occurs, the bottom heater (200) being placed below the process chamber (300), to create a first vertical temperature gradient over the sample in the process chamber (300) and allow melting of the scintillating material;

waiting (S30), while maintaining the temperatures of the top heater (100) and bottom heater (200), until the scintillating material has melted and flowed into the micromechanical structures;

elevating (S40) the temperature of the top heater (100) and stabilizing the temperature to create a second vertical temperature gradient over the sample in the process chamber (300) in an opposite direction than the first vertical temperature gradient;

ramping down (S50) the temperature of the bottom heater (200) to allow solidification of the scintillating material to take place starting from the bottom of the sample; and ramping down (S60) both the top heater (100) and the bottom heater (200) to room temperature.

10. The method of claim 3, wherein the melting and solidification of the scintillating material is controlled according to the following procedure:

ramping up (S10) the top heater (100) and stabilizing at a temperature before melting of the scintillating material occurs, the top heater (100) being placed above the process chamber (300), the sample comprising the scintillating material placed above the micromechanical structures;

ramping up (S20) the bottom heater (200) and stabilizing at a temperature where melting of the scintillating material occurs, the bottom heater (200) being placed below the process chamber (300), to create a first vertical temperature gradient over the sample in the process chamber (300) and allow melting of the scintillating material;

waiting (S30), while maintaining the temperatures of the top heater (100) and bottom heater (200), until the scintillating material has melted and flowed into the micromechanical structures;

elevating (S40) the temperature of the top heater (100) and stabilizing the temperature to create a second vertical temperature gradient over the sample in the process chamber (300) in an opposite direction than the first vertical temperature gradient;

ramping down (S50) the temperature of the bottom heater (200) to allow solidification of the scintillating material to take place starting from the bottom of the sample; and ramping down (S60) both the top heater (100) and the bottom heater (200) to room temperature.

11. The method of claim 2, wherein the micromechanical structures includes pores, trenches and/or any geometry which combines pores and trenches.

12. The method of claim 3, wherein the micromechanical structures includes pores, trenches and/or any geometry which combines pores and trenches.

13. The method of claim 4, wherein the micromechanical structures includes pores, trenches and/or any geometry which combines pores and trenches.

14. The method of claim 5, wherein the micromechanical structures includes pores, trenches and/or any geometry which combines pores and trenches.

\* \* \* \* \*